United States Patent [19]
Tihanyi

[11] Patent Number: 6,028,457
[45] Date of Patent: Feb. 22, 2000

[54] CMOS COMPARATOR

[75] Inventor: Jenoe Tihanyi, Kirchheim, Germany

[73] Assignee: Siemens Aktiengesellschaft, Munich, Germany

[21] Appl. No.: 09/068,353

[22] PCT Filed: Jul. 23, 1997

[86] PCT No.: PCT/DE97/01559

§ 371 Date: May 7, 1998

§ 102(e) Date: May 7, 1998

[87] PCT Pub. No.: WO98/12814

PCT Pub. Date: Mar. 26, 1998

[30] Foreign Application Priority Data

Sep. 18, 1996 [DE] Germany ............... 196 38 087

[51] Int. Cl.$^7$ ....................................... H03K 5/22
[52] U.S. Cl. ............................... 327/77; 327/81
[58] Field of Search ........................ 327/77, 78, 80, 327/81, 143, 198; 323/315

[56] References Cited

U.S. PATENT DOCUMENTS

| | | | |
|---|---|---|---|
| 4,791,324 | 12/1988 | Hodapp | 307/530 |
| 5,030,903 | 7/1991 | Bernard et al. | 323/315 |
| 5,144,223 | 9/1992 | Gillingham | 323/315 |
| 5,285,168 | 2/1994 | Tomatsu et al. | 330/253 |
| 5,334,929 | 8/1994 | Schade, Jr. | 323/315 |
| 5,353,028 | 10/1994 | Wit et al. | 323/315 |
| 5,781,043 | 7/1998 | Slemmer | 327/77 |
| 5,852,376 | 12/1998 | Kraus | 327/143 |

FOREIGN PATENT DOCUMENTS 0 363 332 A2  11/1990  European Pat. Off. ....... H03K 3/356

OTHER PUBLICATIONS

IEEE Proceedings of the 1988 Custom Integrated Circuits Conference, Oscar Agazzi et al, an Analog Front End for Full–Duplex Digital Tranceivers Working on Twisted Pairs, pp. 2641–2644.

*Primary Examiner*—Toan Tran
*Attorney, Agent, or Firm*—Hill & Simpson

[57] ABSTRACT

The CMOS comparator has four p-channel lateral high-voltage transistors ($T_{11}$–$T_{14}$) which form two first current mirrors, and two n-channel lateral high-voltage transistors ($T_{31}$, $T_{32}$) which form a second current mirror. In the current path of the reference voltage, there is a depletion type transistor ($T_2$) which determines the current flowing there. If the input voltage ($U_{IN}$) is equal to the reference voltage ($U_{ref}$), then an equal current flows in both current paths. If the input voltage ($U_{IN}$) deviates from the reference voltage ($U_{ref}$), however, then the output voltage changes dramatically.

11 Claims, 2 Drawing Sheets

CM OS COMPARATOR

BACKGROUND OF THE INVENTION

The invention relates to a CMOS comparator of the type preferably used in self-insulating power IC components.

So-called PROFETs (thermally protected field effect transistors) use such comparators to compare a measured voltage with a reference voltage. These conventional comparators require a relatively large amount of space, however, which obstructs the aim of high integration density.

SUMMARY OF THE INVENTION

The object of the present invention, therefore, is to provide a CMOS comparator with a low space requirement and which is able to output a wide voltage range for a small measurement signal, so that it can be used for switching inductive loads, for example.

In general terms the present invention is a CMOS comparator, particularly for power IC components, in which an input voltage is compared with a reference ground voltage. A voltage signal indicating a difference between the input voltage and the reference ground voltage can be tapped off at an output connection. A first current path is between a reference ground voltage connection and a bias voltage connection, and a second current path is between an input voltage connection and the bias voltage connection. Each of these has at least two first current mirrors and a second current mirror. A current source is arranged in the first current path between one of the first current mirrors and the second current mirror. The output connection is connected between one first current mirror and the second current mirror.

Advantageous developments of the present invention are as follows.

The first current mirrors have p-channel lateral high-voltage transistors which are connected in series with one another in the first and second current paths respectively. The drain of the first p-channel lateral high-voltage transistor is connected to a voltage which is more positive than a bias voltage present at the bias voltage connection.

The current source has an n-channel field effect transistor of the depletion type.

The second current mirror has n-channel lateral high-voltage transistors.

The present invention is also a current mirror switch having a CMOS comparator as described above wherein the high-voltage transistors in the first current mirrors serve as isolators between the CMOS comparator and the power output.

An output transistor is connected with its drain in the direction of positive voltage.

The CMOS comparator as claimed in the invention is distinguished by a simple design and hence a low space requirement. Four p-channel high-voltage transistors, which may preferably be lateral transistors, form two first current mirrors. In the current path on the reference or reference ground voltage side, a current source is then connected to the two p-channel high-voltage transistors in the two first current mirrors, this current source preferably being an n-channel field effect transistor. Another two n-channel high-voltage transistors are then connected to the current source and the two p-channel high-voltage transistors on the measured voltage side; these may also preferably be lateral transistors and form a second current mirror.

The bias current flowing in the current path on the reference side is determined by the current source. The high-voltage transistors in the two first current mirrors are "reversed", i.e. their high-voltage resistant drains are arranged in the direction of the more positive voltage, as compared with the voltages at the sources. This allows any negative voltage spikes to be controlled.

If the input voltage is equal to the reference voltage, then an identical current flows in both current paths since the high-voltage transistors in the cascaded two first current mirrors and in the second current mirror each have a very high dynamic output resistance.

The output voltage picked off between the high-voltage transistors in the first and second current mirrors reacts very quickly to discrepancies between the input voltage and the reference voltage. If the input voltage is smaller than the reference voltage, then the output voltage drops rapidly. Conversely, if the input voltage is larger than the reference voltage, then the output voltage rises rapidly.

The CMOS transistor as claimed in the invention can be used by preference with self-insulating power IC components and is able to output a wide voltage range for a small measurement signal. An example of one advantageous application of the invention is a current mirror high-side switch. In this case, the high-voltage transistors in the first current mirrors can even also be used as isolators between the CMOS comparator and a power output.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
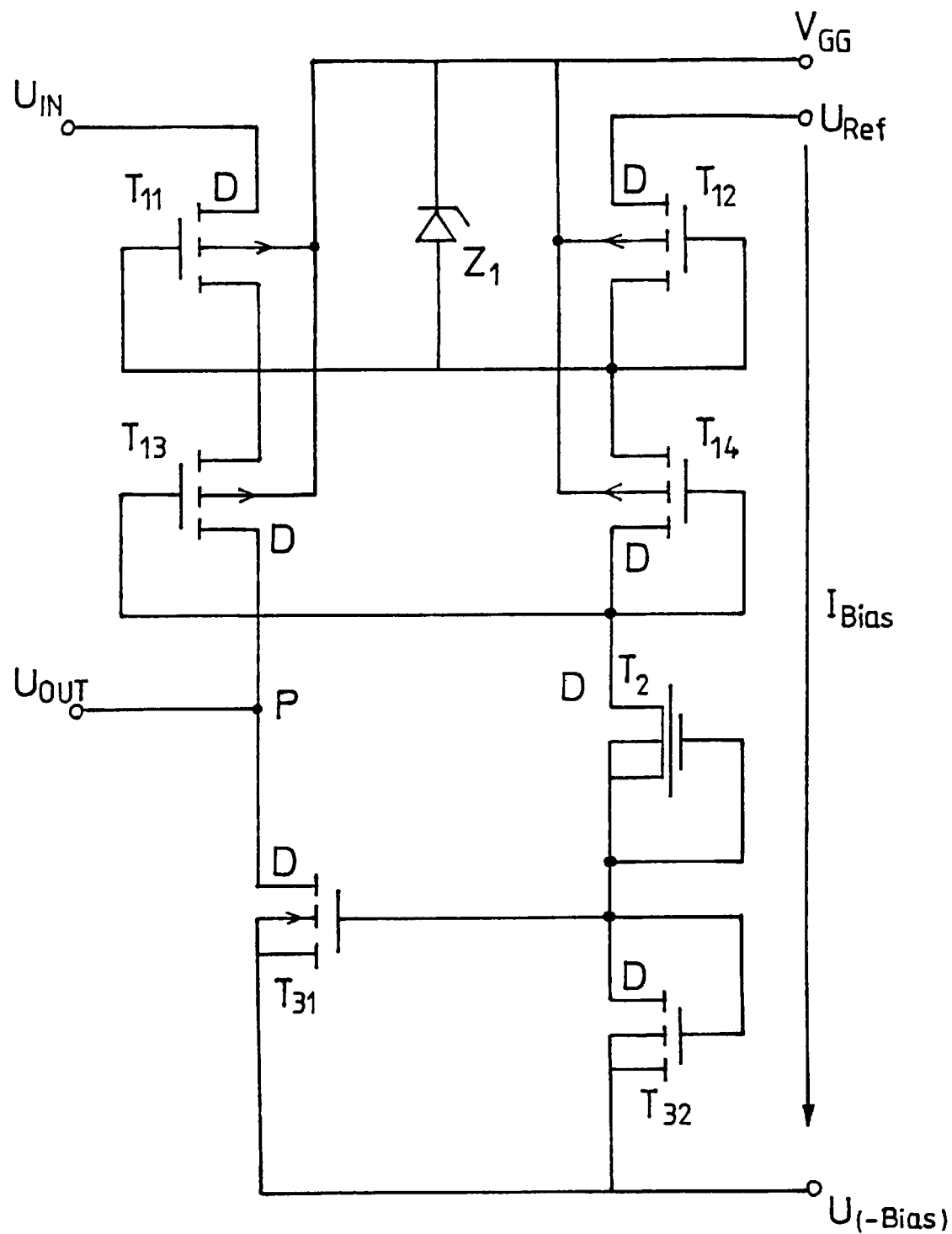
FIG. 1 shows a circuit diagram of the CMOS comparator as claimed in the invention.

In FIG. 1, an input voltage $V_{IN}$ to be measured is present at the drain D of a first p-channel lateral high-voltage field effect transistor $T_{11}$ which forms a current mirror together with a second p-channel lateral high-voltage field effect transistor $T_{12}$. A reference or reference ground voltage $U_{ref}$ is present at the drain D of the second field effect transistor. The source of the first field effect transistor $T_{11}$ and the source of the second field effect transistor $T_{12}$ are respectively connected to the sources of a third and a fourth p-channel lateral high-voltage field effect transistor $T_{13}$ and $T_{14}$ respectively. The third field effect transistor $T_{13}$ forms a further current mirror together with the fourth field effect transistor $T_{14}$. The mutually connected gates of the two field effect transistors $T_{11}$ and $T_{12}$ are connected to the substrate potential $V_{GG}$ via a zener diode $Z_1$. The drain D of the third field effect transistor $T_{13}$ is connected to an output connection $U_{OUT}$ and to the drain D of a first n-channel lateral high-voltage field effect transistor $T_{31}$ forming a current mirror together with a second n-channel lateral high-voltage field effect transistor $T_{32}$. A bias voltage U(-Bias) is applied to the source of the field effect transistor $T_{32}$. An n-channel field effect transistor $T_2$ of the depletion type (depletion type FET) is connected between the drain D of the field effect transistor $T_{14}$ and the drain D of the field effect transistor $T_{32}$ and serves as a current source. Hence, it could also be replaced by a current source if appropriate. The drain of the field effect transistor $T_2$ is connected to the drain of the field effect transistor $T_{14}$.

A constant current $I_{Bias}$ flows in a first current path or branch between the connection for the reference voltage $U_{Ref}$ and the connection for the bias voltage U(-Bias). This current, which is determined by the field effect transistor $T_2$, is mirrored by the current mirrors $T_{11}$, $T_{12}$ and $T_{13}$, $T_{14}$ as well as $T_{31}$, $T_{32}$ in a second current path or branch between the connection for the input voltage $U_{IN}$ and the connection for U(-Bias). If the input voltage $U_{IN}$ is now of equal magnitude to the reference voltage $U_{ref}$, then the two currents in the first and the second current path are also equal to one another since the field effect transistors $T_{31}$, $T_{32}$ and the cascaded field effect transistors $T_{11}$ to $T_{14}$ have a high dynamic output resistance. If the input voltage $U_{IN}$ is smaller than the reference voltage $U_{ref}$, then the potential P at the output connection falls, i.e. the output voltage $U_{OUT}$ drops sharply. Conversely, if the input voltage $U_{IN}$ is larger than the reference voltage $U_{ref}$, then the potential P rises, i.e. the output voltage $U_{OUT}$ rises rapidly. Hence, the output voltage $U_{OUT}$ reacts very quickly to any discrepancy between the input voltage $U_{IN}$ and the reference voltage $U_{ref}$.

Figure 2:
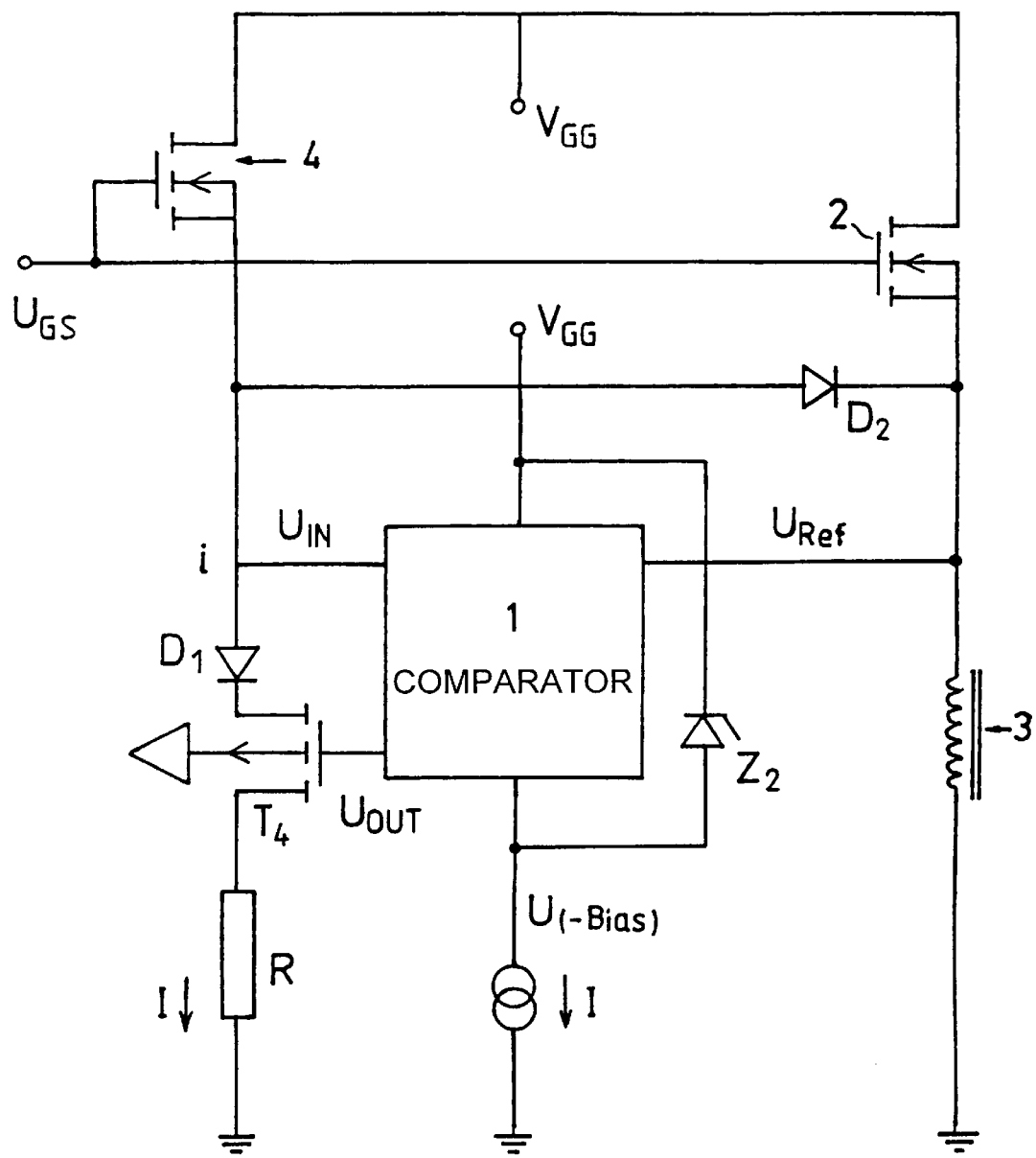
FIG. 2 shows a circuit diagram of a current mirror high-side switch as an example of an application of the CMOS comparator as claimed in the invention.

FIG. 2 shows an advantageous application of the invention in a current mirror high-side switch. A CMOS comparator 1 as claimed in the invention has the input voltage $U_{IN}$ and the reference voltage $U_{ref}$ applied to it and supplies an output voltage $U_{OUT}$ indicating the difference between these voltages. A second zener diode $Z_2$ is connected as a protective diode between the substrate potential $V_{GG}$ and the bias voltage U(-Bias). A primary n-channel field effect transistor 2 serves to switch an inductive load 3 and forms a current mirror together with an n-channel current mirror field effect transistor 4. The gate of the field effect transistor 4 has a gate-source voltage $U_{GS}$ applied to it, which is also applied to the gate of the field effect transistor 2. The drains of the field effect transistors 2 and 4 are respectively connected to the substrate potential $V_{GG}$.

The voltage $U_{OUT}$ of the CMOS comparator is tapped off by a p-channel field effect transistor $T_4$ whose source is connected via a diode $D_1$ to the connection for the input voltage $U_{IN}$ and whose drain is connected to ground via a resistor R. Another diode $D_2$, which is connected in the opposite polarity to the diode $D_1$, is connected between the diode $D_1$ and the source of the primary field effect transistor 2. The diodes $D_1$ and $D_2$ are connected to the source of the field effect transistor 4 by their anodes.

In the current mirror high-side switch shown in FIG. 2, the current I flowing through the input connection for the input voltage may be very small, for example 1/10,000 of the output current I. In the circuit shown in FIG. 2, the p-channel field effect transistors $T_{11}$ to $T_{14}$ in the CMOS comparator 1 serve not only as components of the comparator 1 itself, but also as isolators between the comparator 1 and the power output. If the field effect transistor $T_4$ is designed as a "reversed" p-channel field effect transistor with its drain arranged in the direction of positive voltage, then the diode $D_1$ may be omitted.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A CMOS comparator in which an input voltage is compared with a reference ground voltage, and a voltage signal indicating a difference between the input voltage and the reference ground voltage can be tapped off at an output connection of the CMOS comparator, comprising:

two first current mirrors, each of the first current mirrors having a first transistor and a second transistor;

a second current mirror having a first transistor and a second transistor;

the two first current mirrors and the second current mirror connected in series thereby forming a first current path between a reference ground voltage connection and a bias voltage connection, and forming a second current path between an input voltage connection and the bias voltage connection;

a current source in the first current path between one of the two first current mirrors in the first current path; and the second current mirror in the first current path; and an output connection is connected between one of the two first current mirrors in the second current path and the second current mirror in the second current path.

2. The CMOS comparator as claimed in claim 1, wherein each of the two first current mirrors have p-channel lateral high-voltage transistors, a drain of a first p-channel lateral high-voltage transistor being connected to a voltage which is more positive than a bias voltage present at the bias voltage connection.

3. The CMOS comparator as claimed in claim 1, wherein the current source has an n-channel depletion type field effect transistor.

4. The CMOS comparator as claimed in claim 1, wherein the second current mirror has n-channel lateral high-voltage transistors.

5. The CMOS comparator as claimed in claim 1, wherein the CMOS comparator is used in a current mirror switch.

6. A current mirror switch, comprising:

a CMOS comparator, comprising:
two first current mirrors, each of the first current mirrors having a first and a second transistor;
a second current mirror with a first and a second transistor;
the two first current mirrors and the second current mirror connected in series thereby forming a first current path, between a reference ground voltage connection and a bias voltage connection and a second current path, between an input voltage connection and the bias voltage connection;
a current source in the first current path between one of the two first current mirrors and the second current mirror in the first current path;
an output connection of the CMOS comparator connected between the two first current mirrors in the second current path and the second current mirror in the second current path;
the first current mirrors having p-channel lateral high-voltage transistors;
a drain of a first p-channel lateral high voltage transistor being connected to a voltage which is more positive than a bias voltage present at the bias voltage connection;
the high-voltage transistors in the first current mirrors being isolators between the CMOS comparator and a power output;
a first MOSFET and a second MOSFET having drains and gates thereof connected together, the drains of the first MOSFET and the second MOSFET connected to a substrate potential;
a source of the first MOSFET connected to the input voltage connection of the CMOS comparator;
a source of the second MOSFET connected to the power output;
the power output being connected to the reference around voltage connection of the CMOS comparator and to a first end of a load;
a second end of the load connected to the substrate potential;
a resistor and a third MOSFET connected in series between the input voltage connection of the CMOS comparator and the substrate potential, wherein the third MOSFET is controlled from the output connection of the CMOS comparator.

7. The current mirror switch as claimed in claim 6, wherein the third transistor is coupled with its drain to the input of the CMOS comparator.

8. The current as claimed in claim 6, wherein the current source has an n-channel depletion type field effect transistor.

9. The mirror as claimed in claim 6, wherein the second current mirror has n-channel lateral high-voltage transistors.

10. The current mirror switch as claimed in claim 6, wherein a first diode is connected between the drain of the third transistor and the input voltage connection.

11. The current mirror switch as claimed in claim 10, wherein a second diode is connected in antiseries to the first diode between the input voltage connection and the reference ground voltage connection.

* * * * *